(12) United States Patent
Hyun et al.

(10) Patent No.: US 10,705,370 B2
(45) Date of Patent: Jul. 7, 2020

(54) LIGHT-EMITTING MODULE MANUFACTURING METHOD AND DISPLAY DEVICE

(71) Applicant: LG INNOTEK CO., LTD., Seoul (KR)

(72) Inventors: Seung Han Hyun, Seoul (KR); Hyun Joon Kim, Seoul (KR); Jae Seok Park, Seoul (KR); Kum Tae Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 51 days.

(21) Appl. No.: 16/078,562

(22) PCT Filed: Feb. 23, 2017

(86) PCT No.: PCT/KR2017/002007
§ 371 (c)(1),
(2) Date: Aug. 21, 2018

(87) PCT Pub. No.: WO2017/146489
PCT Pub. Date: Aug. 31, 2017

(65) Prior Publication Data
US 2019/0049760 A1 Feb. 14, 2019

(30) Foreign Application Priority Data
Feb. 23, 2016 (KR) .................. 10-2016-0021556

(51) Int. Cl.
*G02F 1/1335* (2006.01)
*H01L 33/50* (2010.01)
(Continued)

(52) U.S. Cl.
CPC ........ *G02F 1/1335* (2013.01); *H01L 25/0753* (2013.01); *H05B 33/14* (2013.01);
(Continued)

(58) Field of Classification Search
CPC ............... G02F 1/1335; H01L 25/0753; H01L 2933/0033; H01L 33/62; H01L 25/167;
(Continued)

(56) References Cited

U.S. PATENT DOCUMENTS

2006/0089044 A1 4/2006 Kuratomi
2009/0122544 A1 5/2009 Kim et al.
(Continued)

FOREIGN PATENT DOCUMENTS

CN 102289097 12/2011
CN 102760386 10/2012
(Continued)

OTHER PUBLICATIONS

Japanese Patent Publication JP2010157638, machine translation, (Year: 2010).*
(Continued)

*Primary Examiner* — Tracie Y Green
(74) *Attorney, Agent, or Firm* — KED & Associates LLP

(57) ABSTRACT

An embodiment relates to a light emitting module, a light emitting module manufacturing method, a light emitting cabinet, and a display device. The display device of an embodiment includes: a support frame; and a plurality of light emitting cabinets including a plurality of light emitting modules disposed on the support frame, wherein the plurality of light emitting modules may include a substrate, a plurality of light emitting units directly mounted on the substrate, and a black matrix disposed on the substrate to surround each of the plurality of light emitting units. The embodiment may implement uniform color and uniform brightness by providing a light emitting module providing full color, and may implement slimness and high brightness by simplifying a configuration of the light emitting module in a chip on board (COB) type. The embodiment may
(Continued)

implement low power driving and improve productivity and yield by simplifying the configuration of the light-emitting module.

13 Claims, 13 Drawing Sheets

(51) Int. Cl.
*H01L 33/52* (2010.01)
*H05B 33/14* (2006.01)
*H05B 37/02* (2006.01)
*H01L 25/075* (2006.01)
*H05B 47/00* (2020.01)
*H05B 47/10* (2020.01)
*H01L 25/16* (2006.01)
*H01L 33/62* (2010.01)

(52) U.S. Cl.
CPC ............. *H05B 47/00* (2020.01); *H05B 47/10* (2020.01); *H01L 25/167* (2013.01); *H01L 33/50* (2013.01); *H01L 33/52* (2013.01); *H01L 33/62* (2013.01); *H01L 2933/0033* (2013.01)

(58) Field of Classification Search
CPC ......... H01L 33/52; H01L 33/50; H05B 37/00; H05B 33/14
See application file for complete search history.

(56) References Cited

U.S. PATENT DOCUMENTS

| | | | |
|---|---|---|---|
| 2010/0165236 A1 | 7/2010 | Bae et al. | |
| 2011/0141404 A1 | 6/2011 | Kim et al. | |
| 2012/0001209 A1 | 1/2012 | Kim | |
| 2012/0161621 A1 | 6/2012 | Sato | |
| 2013/0126098 A1 | 5/2013 | Bibl et al. | |
| 2014/0299906 A1* | 10/2014 | Kim ...................... | H01L 33/505 257/98 |
| 2015/0188000 A1 | 7/2015 | Huang et al. | |
| 2016/0190400 A1 | 6/2016 | Jung et al. | |
| 2017/0200706 A1 | 7/2017 | Lee | |
| 2019/0157519 A1 | 5/2019 | Jung et al. | |

FOREIGN PATENT DOCUMENTS

| | | |
|---|---|---|
| CN | 103688378 | 3/2014 |
| CN | 203607415 | 5/2014 |
| EP | 2 472 578 | 7/2012 |
| JP | 2010-157638 | 7/2010 |
| KR | 10-2010-0096419 | 9/2010 |
| KR | 10-2012-0085085 | 7/2012 |
| KR | 10-2013-0092893 | 8/2013 |
| KR | 10-2014-0109890 | 9/2014 |
| WO | WO 2014/185693 | 11/2014 |
| WO | WO 2016/013831 | 1/2016 |

OTHER PUBLICATIONS

International Search Report (with English Translation) and Written Opinion dated May 23, 2017 issued in Application No. PCT/KR2017/002007.
European Search Report dated Aug. 5, 2019 issued in Application No. 17756827.6.
Chinese Office Action dated Sep. 26, 2019 issued in Application No. 201780012941.9.

* cited by examiner

LIGHT-EMITTING MODULE MANUFACTURING METHOD AND DISPLAY DEVICE

CROSS-REFERENCE TO RELATED PATENT APPLICATIONS

This application is a U.S. National Stage Application under 35 U.S.C. § 371 of PCT Application No. PCT/KR2017/002007, filed Feb. 23, 2017, which claims priority to Korean Patent Application No. 10-2016-0021556, filed Feb. 23, 2016, whose entire disclosures are hereby incorporated by reference.

TECHNICAL FIELD

An embodiment relates to a light-emitting module, a light-emitting module manufacturing method, a light-emitting cabinet, and a display device.

BACKGROUND ART

A light-emitting device (LED) is a p-n junction diode having a characteristic in which electric energy is converted into light energy, may be produced by a compound semiconductor of Group III and Group V elements or the like on the periodic table, and may represent various colors by adjusting a composition ratio of a compound semiconductor.

In a LED, when a forward voltage is applied, electrons of an n layer are combined with holes of a p layer, and energy corresponding to band gap energy between a conduction band and a valence band may be generated, and this energy is mainly emitted in the form of heat or light, and when the energy is emitted in the form of light, the LED functions.

For example, a nitride semiconductor has received a great interest in a development field of an optical device and a high-output electronic device due to high thermal stability and wide band gap energy thereof. In particular, a blue LED, a green LED and an ultraviolet (UV) LED using the nitride semiconductor are commercialized and used widely.

Recently, the brightness problem of a light-emitting diode has significantly been improved, so that the LED is applied to various devices such as a back light unit of a liquid crystal display device, an electric signage, a display device, and home appliances, etc.

A general liquid crystal display device displays images or videos with light passing through a color filter by controlling the transmission ratio of light of a plurality of light-emitting units in which a LED is mounted and liquid crystal. The general liquid crystal display device includes a back light unit including a light source module and an optical sheet, a TFT array substrate, and a liquid crystal display panel including a color filter substrate and a liquid crystal layer. A general light source module includes a plurality of LED packages in which light-emitting chips are mounted on a lead frame substrate and a printed circuit board on which a plurality of LED packages are mounted, and further includes a driving substrate including a drive circuit for driving a light source module and a liquid crystal display panel.

Recently, high definition above an HD class and displays over 100 inches have been required, but a liquid crystal display device and an organic light-emitting display device having complex configurations that are typically used mainly, have been had difficulty in implementing display devices over 100 inches with high definition due to yield and cost.

DISCLOSURE

Technical Problem

An embodiment is directed to providing a light-emitting module, a manufacturing method of the light-emitting module, a light-emitting cabinet and a display device capable of providing full color.

An embodiment is directed to providing a light-emitting module, a manufacturing method of the light-emitting module, a light-emitting cabinet and a display device capable of implementing uniform color and uniform brightness.

An embodiment is directed to providing a light-emitting module, a manufacturing method of the light-emitting module, a light-emitting cabinet and a display device capable of simplifying a configuration and implementing slimness and high brightness in a chip on board (COB) type.

An embodiment is directed to providing a light-emitting module, a manufacturing method of the light-emitting module, a light-emitting cabinet and a display device capable of driving with low power.

An embodiment is directed to providing a light-emitting module, a manufacturing method of the light-emitting module, a light-emitting cabinet and a display device capable of improving productivity and yield.

An embodiment is directed to providing a display device with excellent linearity of images and videos.

An embodiment is directed to providing a display device capable of implementing a large-sized display device with high-resolution.

An embodiment is directed to providing a display device with excellent color purity and color reproduction.

Technical Solution

A display device of an embodiment includes: a support frame; and a plurality of light-emitting cabinets including a plurality of light-emitting modules disposed on the support frame, wherein the plurality of light-emitting modules may include a substrate, a plurality of light-emitting units directly mounted on the substrate, and a black matrix disposed on the substrate to surround each of the plurality of light-emitting units. The embodiment may implement uniform color and uniform brightness by providing a light-emitting module providing full color, and may implement slimness and high brightness by simplifying a configuration of the light-emitting module in a chip on board (COB) type. The embodiment may implement low power driving and improve productivity and yield by simplifying the configuration of the light-emitting module.

Advantageous Effects

An embodiment may implement uniform color and uniform brightness by providing a light-emitting module providing full color.

An embodiment may simplify a configuration of a light-emitting module and implement slimness and high brightness in a chip on board (COB) type.

An embodiment may implement low power driving by simplifying the configuration of the light-emitting module.

An embodiment may improve productivity and yield by simplifying the configuration of the light-emitting module.

A display device of an embodiment may implement high resolution in a large-sized display device over 100 inches due to excellent linearity of images and videos.

A display device of an embodiment may implement a display device with excellent color purity and color reproduction by implementation of images and videos by a light-emitting unit providing full color.

MODES OF THE INVENTION

Embodiments may be modified to different forms or various embodiments may be combined with each other, and the scope of the present invention is not limited to each embodiment to be described below.

Even though a matter described in a specific embodiment is not described in another embodiment, it may be understood as a related description of another embodiment unless it is opposed or conflicting with the matter in another embodiment.

For example, when features of configuration A are described in a specific embodiment and features of configuration B are described in another embodiment, it should be understood that even though an embodiment in which configuration A and configuration B are combined is not explicitly described, the embodiment falls within the scope of the present invention as long as there is no opposed or conflicting explanations.

Hereinafter, the embodiments of the present invention capable of specifically realizing the objectives will be described with reference to the accompanying drawings.

In the description of embodiments according to the present invention, when it is stated as being formed "on" or "under" of each element, the term "on" or "under" includes both meanings that two elements are in direct contact with each other (directly) and one or more other elements are interposed between the above two elements (indirectly). Also, when it is represented as "on or under", it may include a meaning of a downward direction as well as an upper direction with reference to one element.

A semiconductor device may include various electronic devices such as a light-emitting device and a light receiving device, and the light-emitting device and the light receiving device both may include a first conductive type semiconductor layer, an active layer, and a second conductive type semiconductor layer.

A semiconductor device according to the embodiment may be a light-emitting device.

A light-emitting device emits light by the recombination of electrons and holes, and wavelengths of the light are determined by unique energy band gaps of materials. Therefore, the emitted light may vary according to the composition of the materials.

Figure 1:
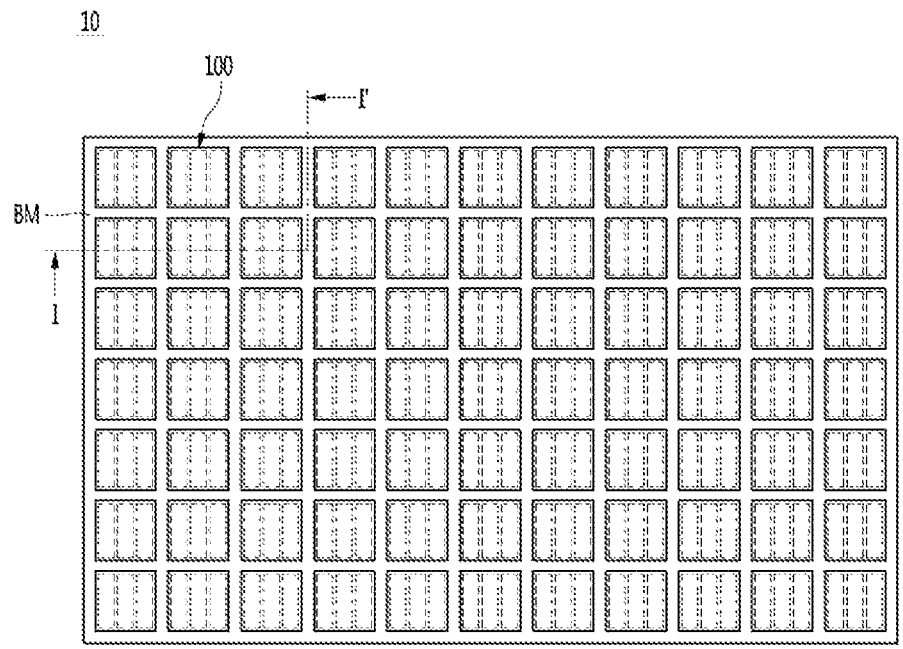
FIG. 1 is a perspective view illustrating a light-emitting module of a first embodiment.
Figure 2:
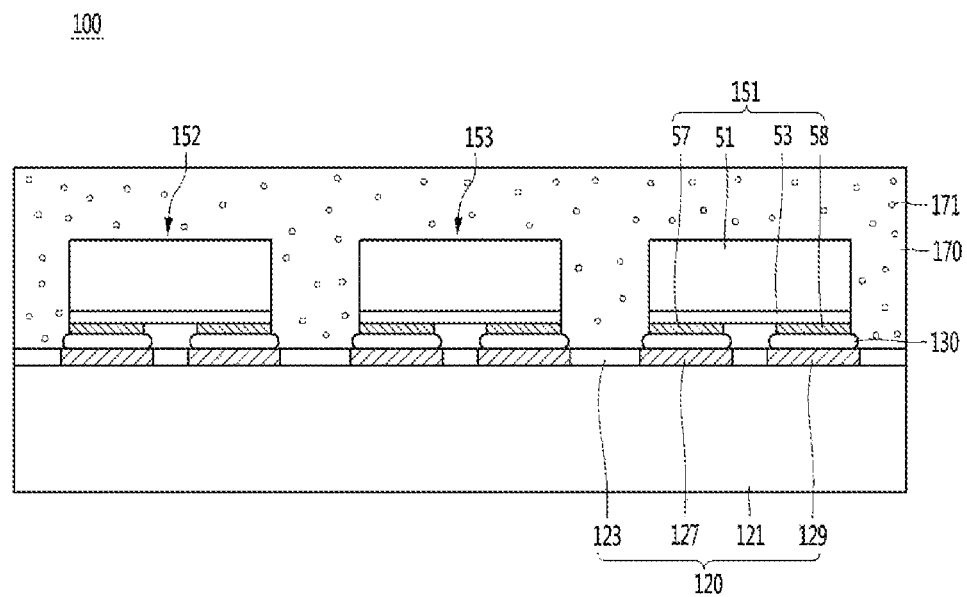
FIG. 2 is a cross-sectional view illustrating a light-emitting unit of the first embodiment.
Figure 3:
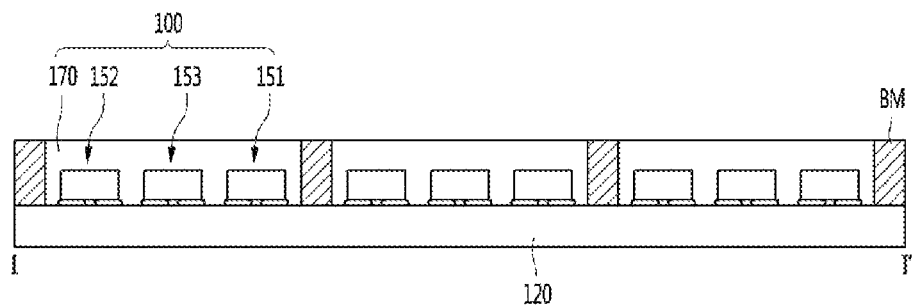
FIG. 3 is a cross-sectional view illustrating a light-emitting module taken along a line I-I' of FIG. 1.
Figure 4:
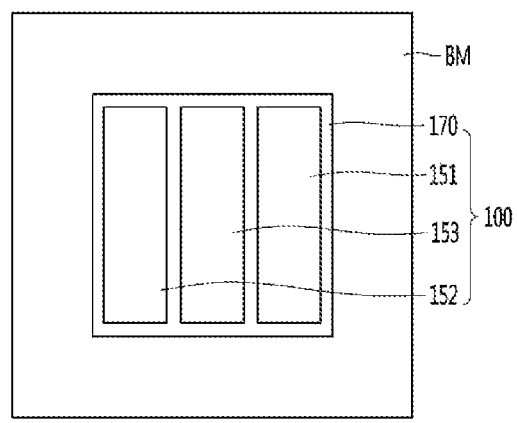
FIG. 4 is a plan view illustrating a light-emitting unit and a black matrix of the light-emitting module of the first embodiment.

FIG. 1 is a perspective view illustrating a light-emitting module of a first embodiment, FIG. 2 is a cross-sectional view illustrating a light-emitting unit of the first embodiment, FIG. 3 is a cross-sectional view illustrating a light-emitting module taken along a line I-I' of FIG. 1, and FIG. 4 is a plan view illustrating a light-emitting unit and a black matrix of the light-emitting module of the first embodiment.

As shown in FIGS. 1 to 4, a light-emitting module 10 of a first embodiment may implement a simplified structure, slimness, and high brightness that implement full color videos or images. For this, the light-emitting module 10 of the first embodiment may include a light-emitting unit 100 having a width of less than 500 μm. The light-emitting unit 100 may be directly mounted on a substrate 120 in a chip on board (COB) type. Although not shown in the drawing, a driving circuit (not shown) configured to drive the light-emitting unit 100 may be mounted at a lower surface of the substrate 120.

The light-emitting unit 100 may include first to third light-emitting devices 151, 152, and 153 and a molding part 170.

Each of the first to third light-emitting devices 151, 152, and 153 may have a width of 200 μm or less. That is, each of the first to third light-emitting devices 151, 152, and 153 may be a micro light-emitting device having a width of 200 μm or less, so that each of the first to third light-emitting devices 151, 152, and 153 may provide the light-emitting unit 100 having a width of less than 500 μm. The embodiment may provide a single cell light-emitting module 10 of 0.5×0.5 (mm) to implement a simplified structure, slimness, and high brightness that implement full color videos or images. The first to third light-emitting devices 151, 152, and 153 may be disposed to be spaced apart a predetermined distance from each other. The first to third light-emitting devices 151, 152, and 153 may be disposed in parallel with each other in one direction, but are not limited thereto. The first to third light-emitting devices 151, 152, and 153 may be directly mounted on the substrate 120. For example, the first to third light-emitting devices 151, 152, and 153 may be directly mounted on the substrate 120 in a COB type. In the light-emitting module 10 of the first embodiment, the first to third light-emitting devices 151, 152, and 153 are directly mounted on the substrate 120 in the COB type, so that a configuration may be simplified, and slimness and high brightness may be implemented.

The first to third light-emitting devices 151, 152, and 153 may be mounted on the substrate 120 by a surface mounter technology (SMT). The SMT is a method of mounting the first to third light-emitting devices 151, 152, and 153 on the substrate 120 by using solder paste 130. The solder paste 130 may be a metal paste. For example, the solder paste 130 may include an alloy such as AuSn and NiSn, but is not limited thereto.

The first to third light-emitting devices 151, 152, and 153 may emit different colors. For example, the first light-emitting device 151 may emit light of a red wavelength, the second light-emitting device 152 may emit light of a green wavelength, and the third light-emitting device 153 may emit light of a blue wavelength. As another example, the first to third light-emitting devices 151, 152, and 153 may include an ultraviolet (UV) light-emitting layer and a fluorescent layer.

The first to third light-emitting devices 151, 152, and 153 may include a sapphire substrate 51, a light-emitting layer 53, and first and second light-emitting device electrodes 57 and 59. The first to third light-emitting devices 151, 152, and 153 may have a flip chip structure in which the first and second light-emitting device electrodes 57 and 59 are disposed at a lower portion of the substrate 120 and are directly mounted on the substrate 120.

In the light-emitting module 10 of the first embodiment, light emitted from the first to third light-emitting devices 151, 152, and 153 may be mixed to implement full color. Heights of the first to third light-emitting devices 151, 152, and 153 may be equal to each other. The first to third light-emitting devices 151, 152, and 153 may have the same height and the sapphire substrate 51 of the first to third light-emitting devices 151, 152, and 153 may be 100 μm or more. The first embodiment may improve light mixing and implement volume light emission by the sapphire substrate 51 of 100 μm or more and the first to third light-emitting devices 151, 152, and 153 of the same height.

The first to third light-emitting devices 151, 152, and 153 may be disposed at distances of 50 μm or more. The first to third light-emitting devices 151, 152, and 153 may be disposed at distances of 50 μm or more to improve damage caused by friction of the first to third light-emitting devices 151, 152, and 153 in a mounting process. The first to third light-emitting devices 151, 152, and 153 may be disposed at distances of 50 μm or more to improve loss of light due to interference of each of light of the first to third light-emitting devices 151, 152, and 153 with each other.

The molding part 170 may be disposed on the substrate 120. The molding part 170 may be disposed on upper portions and side surfaces of the first to third light-emitting devices 151, 152, and 153. The molding part 170 may be in direct contact with the substrate 120 and the first to third light-emitting devices 151, 152, and 153.

A top view of the molding part 170 may be a square structure, but is not limited thereto. A top view shape of the molding part 170 may correspond to a pixel structure of a display device. For example, the top view of the molding part 170 may be varied in various shapes such as a rectangle, a polygon, an ellipse, a circle, or the like. The molding part 170 may include a black filler 171. The black filler 171 may implement an entire light-emitting surface in black color when the light-emitting module 10 does not emit light, so that appearance quality may be improved. For example, when the light-emitting module 10 is included in a display device, a display surface of black color may be implemented at the time of stopping driving of the display device, so that appearance quality may be improved.

The molding part 170 may protect the first to third light-emitting devices 151, 152, and 153, and may have a thickness capable of improving light loss from the first to third light-emitting devices 151, 152, and 153. For example, a height between an upper surface of the molding part 170 and upper surfaces of the first to third light-emitting devices 151, 152, and 153 may be lower than that of the sapphire substrate 51 of each of the first to third light-emitting devices 151, 152, and 153. For example, the height of the sapphire substrate 51 may be 100 μm, and the height between the upper surface of the molding part 170 and the upper surfaces of the first to third light-emitting devices 151, 152, and 153 may be 100 μm or less. The height between the upper surface of the molding part 170 and the upper surfaces of the first to third light-emitting devices 151, 152, and 153 may be 50 μm or less. The height of the molding part 170 on the first to third light-emitting devices 151, 152, and 153 may be smaller than that of the sapphire substrate 51. For example, the height of the molding part 170 on the first to third light-emitting devices 151, 152, and 153 may be less than 50% of that of the sapphire substrate 51. As the height of the molding part 170 on the first to third light-emitting devices 151, 152, and 153 is lower than that of the sapphire substrate 51, straightness of light may be improved. In the first embodiment, the height between the upper surface of the molding part 170 and the upper surfaces of the first to third light-emitting devices 151, 152, and 153 may be formed to be lower than that of the sapphire substrate 51 so that mixing and straightness of light may be improved. Here, the height of the sapphire substrate 51 of 100 μm may be a height for volume light emission from each of the first to third light-emitting devices 151, 152, and 153, but is not limited thereto. For example, the height of the sapphire substrate 51 may be 100 μm or less.

The molding part 170 may have a predetermined distance between side surfaces adjacent to the first to third light-emitting devices 151, 152, and 153. The distance may be between the side surfaces of the molding part 170 closest to the first to third light-emitting devices 151, 152, and 153. The distance may be 25 μm or more. The distance may prevent the first to third light-emitting devices 151, 152, and 153 from being damaged during a sawing process in which the unit light-emitting unit 100 is separated after the molding part 170 is formed.

A black matrix BM may include functions of preventing light leakage and improving appearance quality. The black matrix BM may be an opaque organic material. For example, the black matrix BM may be a black resin. The black matrix BM may include openings corresponding to the first to third light-emitting devices 151, 152, and 153. One opening may correspond to one pixel of a display device, and may accommodate one light-emitting unit 100. A cross-sectional thickness of the black matrix BM may be the same as a cross-sectional thickness of the light-emitting unit 100. The black matrix BM may be a matrix structure surrounding all outer side surfaces of the plurality of light-emitting units 100. The black matrix BM blocks interference of light between the adjacent light-emitting units 100 and provides a screen of black color at the time of stopping driving of the display device, so that appearance quality may be improved.

In the first embodiment, the first to third light-emitting devices 151, 152, and 153 and the molding part 170, capable of being individually driven, may be directly mounted on the substrate 120, and the light-emitting module 10 of a simplified structure in which a black matrix BM of a matrix type surrounding each side surface of each light-emitting unit 100 is disposed on the substrate 120 may be provided. That is, in the first embodiment, the light-emitting module 10 capable of implementing videos and images by implementing full color may be provided, and slimness and high brightness may be implemented by simplifying a configuration of the light-emitting module 10.

In the first embodiment, an electrical connection configuration may be simplified by a structure of the light-emitting module 10 of the COB type, so that power consumption may be reduced.

FIGS. 5 to 9 are views illustrating a method for manufacturing a light-emitting module of the first embodiment.

Figure 5:
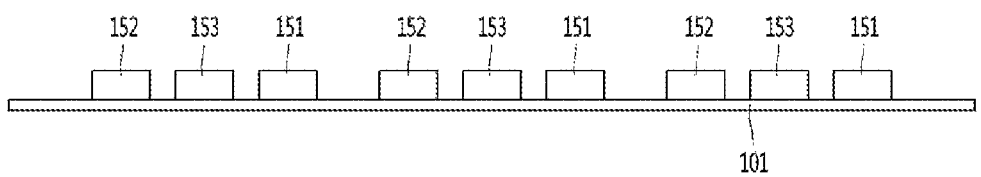
FIGS. 5 to 9 are views illustrating a manufacturing method of a light-emitting module of the first embodiment.

Referring to FIG. 5, in the method of manufacturing the light-emitting module of the first embodiment, a plurality of first to third light-emitting devices 151, 152, and 153 may be disposed on a first carrier film 101.

The plurality of first to third light-emitting devices 151, 152, and 153 may be disposed to be spaced apart a predetermined distance from each other. The first to third light-emitting devices 151, 152, and 153 may emit different colors. For example, the first light-emitting device 151 may emit light of a red wavelength, the second light-emitting device 152 may emit light of a green wavelength, and the third light-emitting device 153 may emit light of a blue wavelength. As another example, the first to third light-emitting devices 151, 152, and 153 may include a UV light-emitting layer and a fluorescent layer. The first to third light-emitting devices 151, 152, and 153 may be a flip chip in which electrodes are disposed on a lower surface in contact with the first carrier film 101, but are not limited thereto. Heights of the first to third light-emitting devices 151, 152, and 153 may be equal to each other. The first to third light-emitting devices 151, 152, and 153 may be disposed at distances of 50 μm or more.

The first carrier film 101 may include an adhesive layer at one surface thereof. The first carrier film 101 may be silicone-based, but is not limited thereto.

Figure 6:
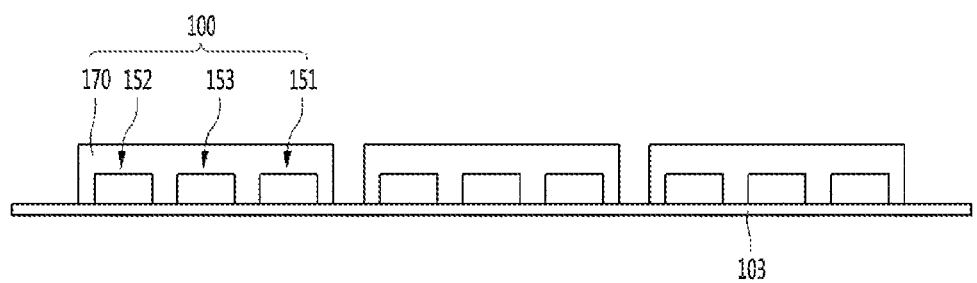

Referring to FIG. 6, a molding layer 170a may be formed on the first carrier film 101 and the plurality of first to third light-emitting devices 151, 152, and 153. The molding layer 170a may include a light-transmitting resin material such as epoxy or silicone. The molding layer 170a may be in direct contact with the first carrier film 101 and the first to third light-emitting devices 151, 152, and 153. The molding layer 170a may include a black filler. The black filler may implement an entire light-emitting surface in black color when the light-emitting module does not emit light, so that appearance quality may be improved. For example, the black filler may improve appearance quality of a light-emitting module used in a signage, an indoor and outdoor electronic display board, and a public display.

Figure 7:
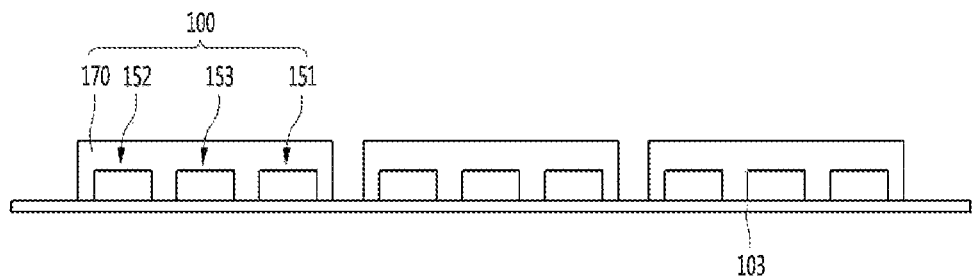

Referring to FIG. 7, a unit light-emitting unit 100 may be formed by a cutting process. The cutting process may form a molding part 170 by etching or physically removing a molding layer. Then, the light-emitting unit 100 may include an aligning to a second carrier film 103. The light-emitting unit 100 may be separated from the first carrier film and may be aligned on the second carrier film 103. The aligning may be disposing of the light-emitting unit 100, which is separated via the cutting process on the first carrier film, on the second carrier film 103 to implement in a block unit.

Figure 8:
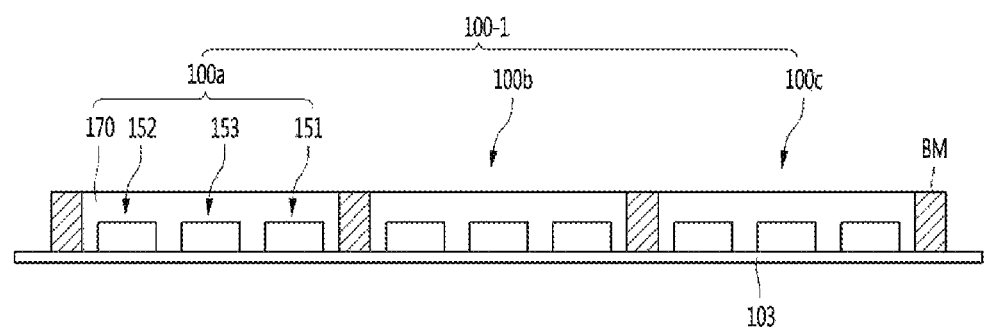

Referring to FIG. 8, a black matrix BM may be formed on the second carrier film 103 to manufacture a light-emitting device black 100-1. The black matrix BM may be formed to surround outer side surfaces of the first to third light-emitting devices 151, 152, and 153. The black matrix BM may be formed by a screen printing process, a dispensing process, or an injection process, but is not limited thereto. A light-emitting device block 100-1 including the first to third light-emitting devices 151, 152, and 153 may improve yield by improving processability in a subsequent process of manufacturing a light-emitting module, and since a plurality of light-emitting units 100 are aligned, defective alignment may be improved.

Figure 9:
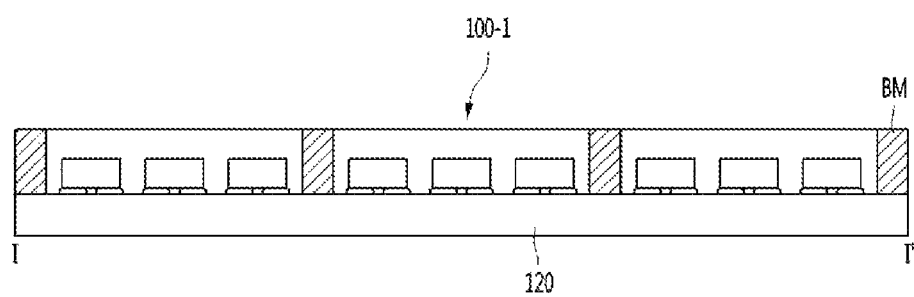

Referring to FIG. 9, in the light-emitting module of the first embodiment, the light-emitting device block 100-1 may be directly mounted on the substrate 120 in a COB type. For example, the light-emitting device block 100-1 may be separated from the second carrier film and mounted on the substrate 120 by SMT. The SMT may use solder paste. The solder paste may be a metal paste. For example, the solder paste may include an alloy such as AuSn and NiSn, but is not limited thereto.

In the method of manufacturing the light-emitting module of the first embodiment of FIGS. 5 to 9, the light-emitting device block 100-1 may be manufactured by using the first and second carrier films 101 and 103, the light-emitting device block 100-1 may improve processability and yield by being directly mounted on the substrate 120 in the COB type, and defective alignment of the light-emitting unit 100 may be improved.

In the light-emitting module of the first embodiment, not only slimness and high brightness may be implemented by simplifying a configuration in the COB type, but also power consumption may be reduced by simplifying an electrical connection configuration.

FIGS. 10 to 14 are views illustrating a method for manufacturing a light-emitting module of a second embodiment.

Figure 10:
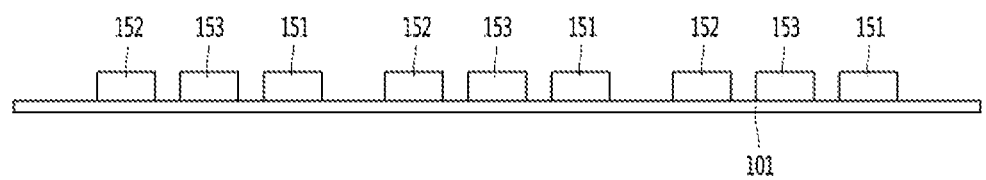
FIGS. 10 to 14 are views illustrating a manufacturing method of a light-emitting module of a second embodiment.
Figure 11:
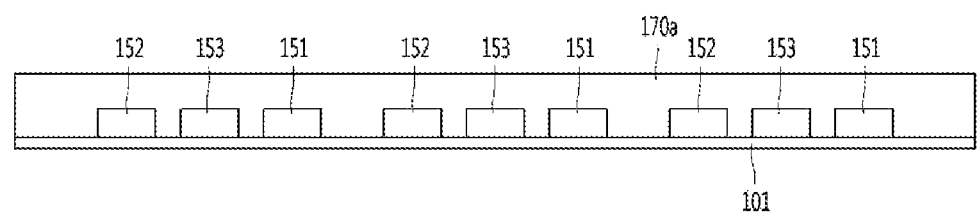

Referring to FIGS. 10 and 11, the method of manufacturing the light-emitting module of the second embodiment may adopt technical features of the method of manufacturing the light-emitting module of the first embodiment of FIGS. 5 and 6.

Figure 12:
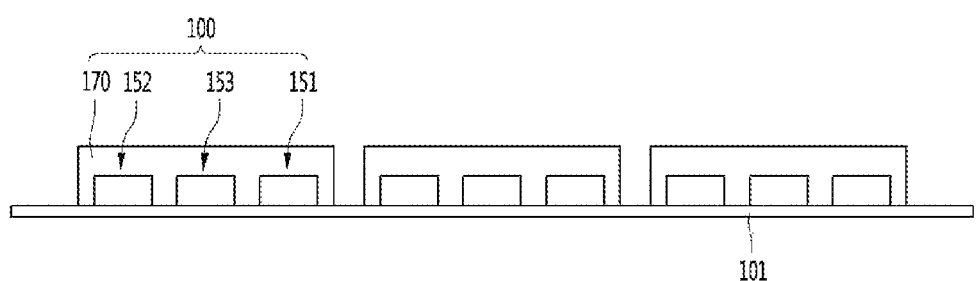

Referring to FIG. 12, a unit light-emitting unit 100 may be formed on a first carrier film 101 by a cutting process. The cutting process may form a molding part 170 by etching or physically removing a molding layer.

Figure 13:
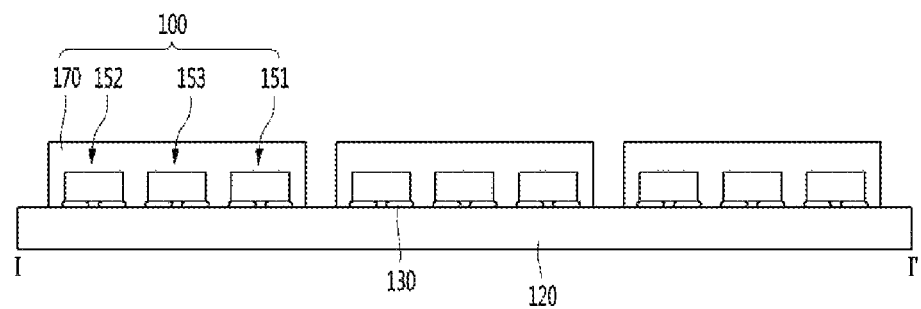

Referring to FIG. 13, the unit light-emitting unit 100 may be directly mounted on the substrate 120 in a COB type. For example, the light-emitting unit 100 may be separated from the first carrier film and mounted on the substrate 120 by SMT. The SMT may use solder paste. The solder paste may be a metal paste. For example, the solder paste may include an alloy such as AuSn and NiSn, but is not limited thereto.

Figure 14:
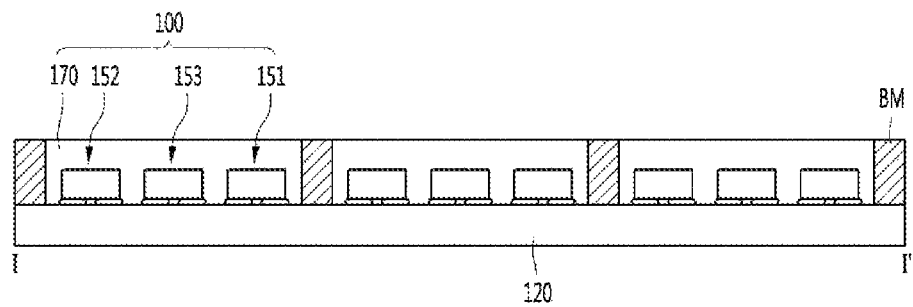

Referring to FIG. 14, a black matrix BM may be formed on the substrate 120 to manufacture a light-emitting device black 100-1. The black matrix BM may be formed to surround outer side surfaces of the first to third light-emitting devices 151, 152, and 153. The black matrix BM may be formed by a screen printing process, a dispensing process, or an injection process, but is not limited thereto.

In the method of manufacturing the light-emitting module of the second embodiment shown in FIGS. 10 to 14, the unit light-emitting unit 100 may be directly mounted on the substrate 120 in the COB type after the unit light-emitting unit 100 is manufactured on the first carrier film 101 to form a black matrix BM.

In the light-emitting module of the second embodiment, not only slimness and high brightness may be implemented by simplifying a configuration in the COB type, but also power consumption may be reduced by simplifying an electrical connection configuration.

FIGS. 15 to 18 are views illustrating a method for manufacturing an light-emitting module of a third embodiment.

Figure 15:
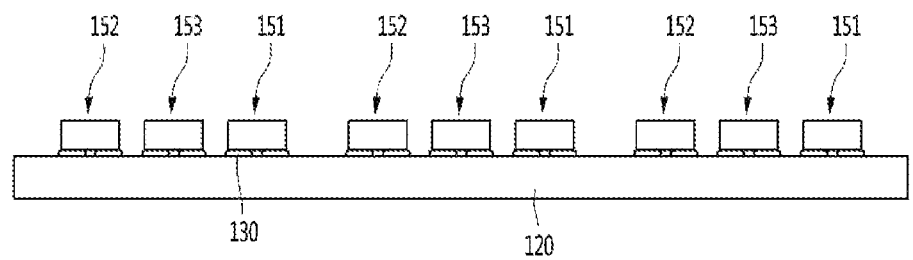
FIGS. 15 to 18 are views illustrating a manufacturing method of a light-emitting module of a third embodiment.

Referring to FIG. 15, a plurality of first to third light-emitting devices 151, 152, and 153 may be directly mounted on a substrate 120 in a COB type. The first to third light-emitting devices 151, 152, and 153 may be mounted on the substrate 120 by SMT. The SMT may use solder paste. The solder paste may be a metal paste. For example, the solder paste may include an alloy such as AuSn and NiSn, but is not limited thereto.

Figure 16:
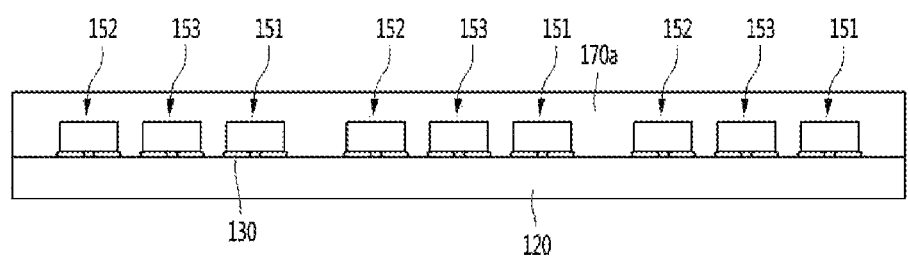

Referring to FIG. 16, a molding layer 170a may be formed on the substrate 120 and the plurality of first to third light-emitting devices 151, 152, and 153. The molding layer 170a may include a light-transmitting resin material such as epoxy or silicone. The molding layer 170a may be in direct contact with the substrate 120 and the first to third light-emitting devices 151, 152, and 153. The molding layer 170a may include a black filler. The black filler may implement an entire light-emitting surface in black color when the light-emitting module does not emit light, so that appearance quality may be improved.

Figure 17:
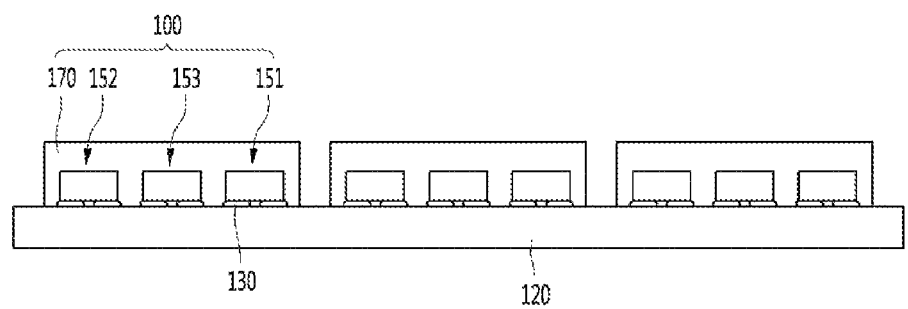

Referring to FIG. 17, a unit light-emitting unit 100 may be formed on the substrate 120 by a cutting process. The cutting process may form a molding part 170 by etching or physically removing a molding layer.

Figure 18:
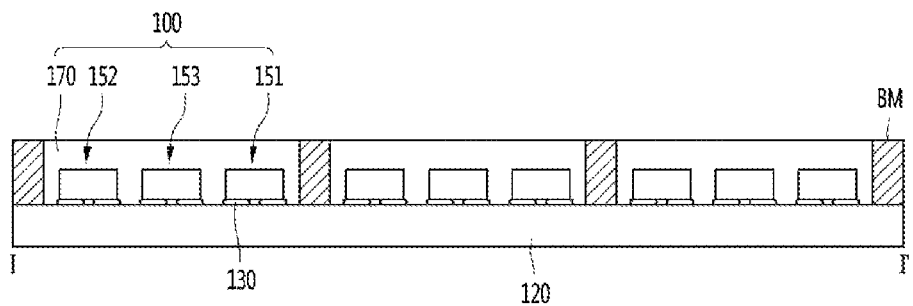

Referring to FIG. 18, a black matrix BM may be formed on the substrate 120. The black matrix BM may be formed to surround an outer side surface of the light-emitting unit 100. The black matrix BM may be formed by a screen printing process, a dispensing process, or an injection process, but is not limited thereto.

In the method of manufacturing the light-emitting module of the third embodiment of FIGS. 15 to 18, the first to third light-emitting devices 151, 152, and 153 may be directly mounted on the substrate 120 in the COB type to form the molding part 170 and the black matrix BM, so that a manufacturing process may be simplified.

In the light-emitting module of the third embodiment, not only slimness and high brightness may be implemented by simplifying a configuration in the COB type, but also power consumption may be reduced by simplifying an electrical connection configuration.

Figure 19:
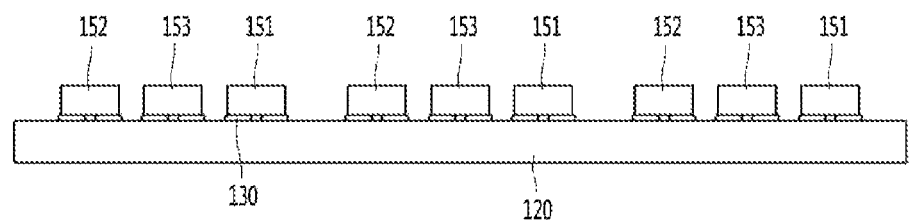
FIGS. 19 to 21 are views illustrating a manufacturing method of a light-emitting module of a fourth embodiment.
Figure 20:
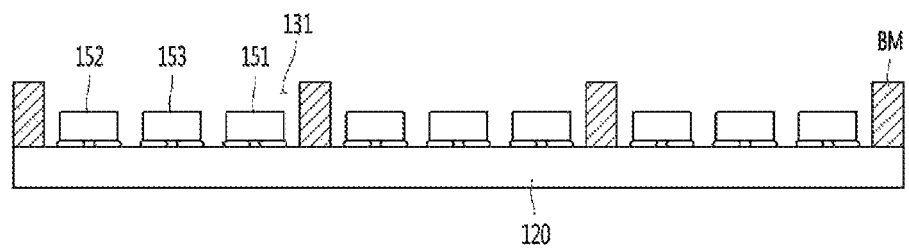
Figure 21:
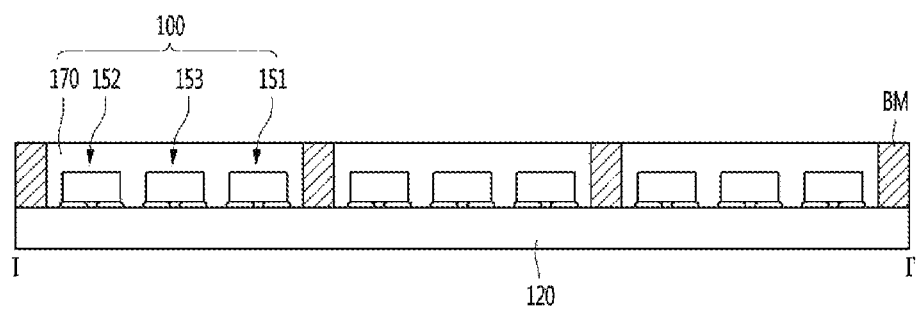

FIGS. 19 to 21 are views illustrating a method for manufacturing a light-emitting module of a fourth embodiment.

Referring to FIG. 19, a plurality of first to third light-emitting devices 151, 152, and 153 may be directly mounted on a substrate 120 in a COB type. The first to third light-emitting devices 151, 152, and 153 may be mounted on the substrate 120 by SMT. The SMT may use solder paste. The solder paste may be a metal paste. For example, the solder paste may include an alloy such as AuSn and NiSn, but is not limited thereto.

Referring to FIG. 20, a black matrix BM may be formed on the substrate 120. The black matrix BM may be spaced apart a predetermined distance from the plurality of first to third light-emitting devices 151, 152, and 153. The black matrix BM may form a cavity 131 including each of the first to third light-emitting devices 151, 152, and 153. The black matrix BM may form a partition wall in a matrix type to form the cavity 131. The black matrix BM may be formed by a screen printing process, a dispensing process, or an injection process, but is not limited thereto.

Referring to FIG. 21, a molding part 170 may be formed in the cavity formed by the black matrix BM. The molding part 170 may be formed on the substrate 120 by one of transfer molding, dispensing molding, compression molding, and screen printing methods. A molding layer 170a may be in direct contact with the black matrix BM, the substrate 120, and the first to third light-emitting devices 151, 152, and 153. The molding layer 170a may include a black filler. The black filler may implement an entire light-emitting surface in black color when the light-emitting module does not emit light, so that appearance quality may be improved.

In the method of manufacturing the light-emitting module of the fourth embodiment of FIGS. 19 to 21, the molding part 170 is formed after mounting the first to third light-emitting devices 151, 152, and 153 directly on the substrate 120 in the COB type and forming the black matrix BM to eliminate the cutting process of the method of manufacturing the light-emitting module of the third embodiment, so that a manufacturing process may be simplified.

In the light-emitting module of the fourth embodiment, not only slimness and high brightness may be implemented by simplifying a configuration in the COB type, but also power consumption may be reduced by simplifying an electrical connection configuration.

FIGS. 22 to 25 are views illustrating a method for manufacturing a light-emitting module of a fifth embodiment.

Figure 22:
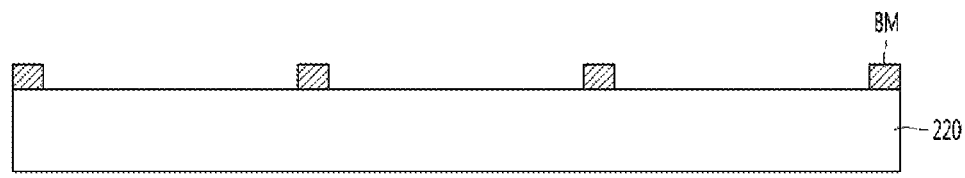
FIGS. 22 to 25 are views illustrating a manufacturing method of a light-emitting module of a fifth embodiment.

Referring to FIG. 22, a black matrix BM may be formed on a substrate 220. The black matrix BM may be spaced apart from each other at a predetermined distance. The black matrix BM may be formed by a screen printing process, a dispensing process, or an injection process, but is not limited thereto. The black matrix BM may form a partition wall in a matrix type.

Figure 23:
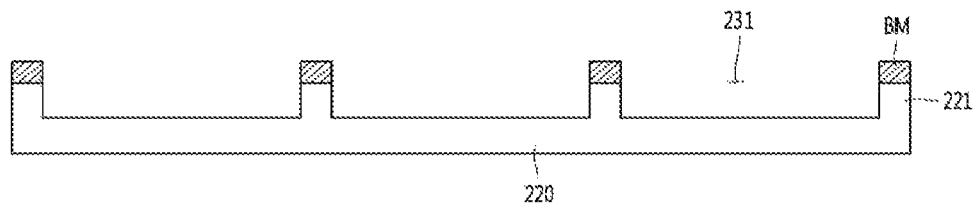

Referring to FIG. 23, a cavity 231 may be formed by etching the substrate 220 using the black matrix BM as a mask. Although not shown in the drawing, a substrate pad (not shown) may be exposed on a bottom surface of the cavity 231.

Figure 24:
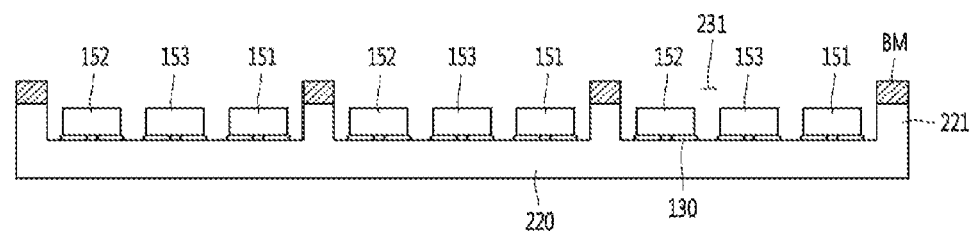

Referring to FIG. 24, a plurality of first to third light-emitting devices 151, 152, and 153 may be directly mounted on the substrate 220 on the bottom surface of the cavity 231 in a COB type. The first to third light-emitting devices 151, 152, and 153 may be mounted on the substrate 220 by SMT. The SMT may use solder paste. The solder paste may be a metal paste. For example, the solder paste may include an alloy such as AuSn and NiSn, but is not limited thereto.

Figure 25:
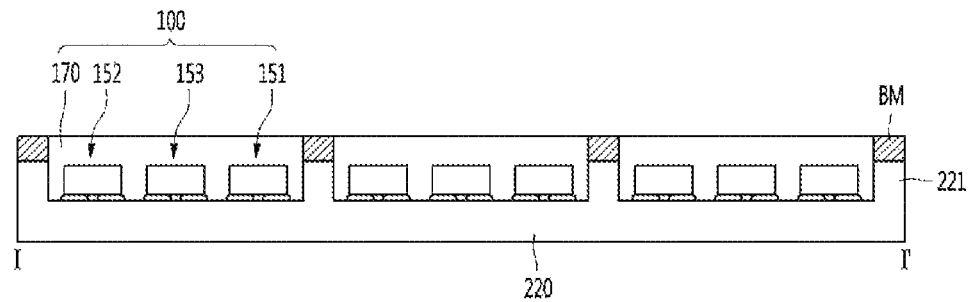

Referring to FIG. 25, a molding part 170 may be formed in the cavity formed by the black matrix BM. The molding part 170 may be formed on the substrate 220 by one of transfer molding, dispensing molding, compression molding, and screen printing methods. The molding part 170 may be in direct contact with the black matrix BM, the substrate 220, and the first to third light-emitting devices 151, 152, and 153. The molding part 170 may include a black filler. The black filler may implement an entire light-emitting surface in black color when the light-emitting module does not emit light, so that appearance quality may be improved.

In FIGS. 22 to 25, in the method of manufacturing the light-emitting module of the fifth embodiment, the black matrix BM may be formed on the substrate 220, the substrate 220 may be etched to form the cavity 231, then the first to third light-emitting devices 151, 152, and 153 may be mounted directly on the substrate 220 on the bottom surface of the cavity 231 in the COB type, and the molding part 170 may be formed, so that the cutting process of the method of manufacturing the light-emitting module of the third embodiment may be removed, thereby simplifying a manufacturing process.

In the light-emitting module of the fifth embodiment, not only slimness and high brightness may be implemented by simplifying a configuration in the COB type, but also power consumption may be reduced by simplifying an electrical connection configuration.

Figure 26:
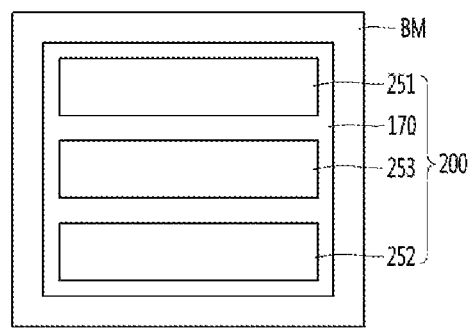
FIG. 26 is a plan view illustrating a light-emitting unit and a black matrix of a light-emitting module of the second embodiment.
Figure 27:
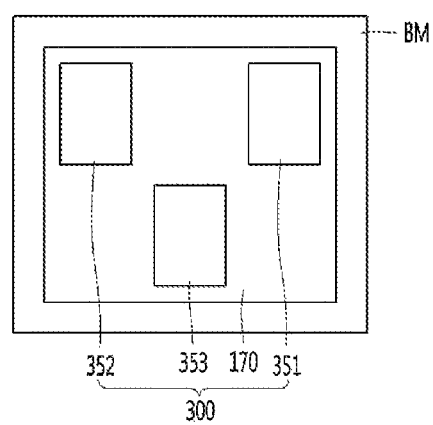
FIG. 27 is a plan view illustrating a light-emitting unit and a black matrix of a light-emitting module of the third embodiment.
Figure 28:
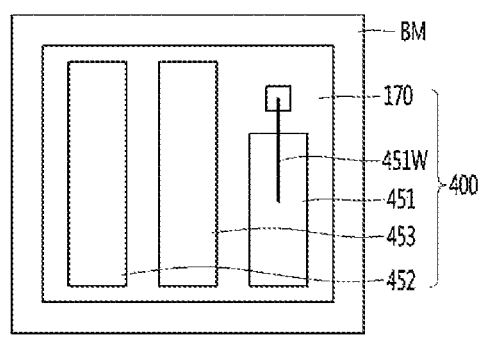
FIG. 28 is a plan view illustrating a light-emitting unit and a black matrix of a light-emitting module of the fourth embodiment.

FIGS. 26 to 28 are plan views illustrating a light-emitting unit and a black matrix of second to fourth embodiments.

Referring to FIG. 26, a light-emitting unit 200 of the second embodiment may employ technical features of the light-emitting unit 100 of the first embodiment of FIGS. 1 to 4 except for first to third light-emitting devices 251, 252, and 253.

The first to third light-emitting devices 251, 252, and 253 may be disposed in a direction orthogonal to the first to third light-emitting devices 151, 152, and 153 of the first embodiment.

Referring to FIG. 27, a light-emitting unit 300 of the third embodiment may employ technical features of the light-emitting unit 100 of the first embodiment of FIGS. 1 to 4 except for first to third light-emitting devices 351, 352, and 353.

The first to third light-emitting devices 351, 352, and 353 may have an overlap region overlapping in one direction, or may not have an overlap region. For example, when the first to third light-emitting devices 351, 352, and 353 have an overlap region in one direction, the overlap region may be ⅓ or less of a width of each of the first to third light-emitting devices 351, 352, and 353. The overlap region may be ¼ or less of the width of each of the first to third light-emitting devices 351, 352, and 353. The overlap region may be 10% or less of the width of each of the first to third light-emitting devices 351, 352, and 353. As the overlap region is smaller, light interference and light efficiency may be improved. When the first to third light-emitting devices 351, 352, and 353 do have an overlap region in one direction, light interference between the first to third light-emitting devices 351, 352, and 353 may be reduced, so that light efficiency may be improved.

The first light-emitting device 351 may be disposed adjacent to a first corner of the light-emitting unit 300 and the second light-emitting device 352 may be disposed adjacent to a second corner of the light-emitting unit 300. The first and second corners may be disposed in parallel in one direction. The third light-emitting device 353 may be disposed adjacent to a side portion of the light-emitting unit 300 connecting third and fourth corners symmetrical to the first and second corners.

Referring to FIG. 28, a light-emitting unit 400 of the fourth embodiment may employ technical features of the light-emitting unit 100 of the first embodiment of FIGS. 1 to 4 except for first to third light-emitting devices 451, 452, and 453.

The first light-emitting device 451 may be a vertical type in which electrodes are disposed at upper and lower portions. The first light-emitting device 451 may emit light having a red wavelength. The first light-emitting device 451 may be a vertical type to improve red light extraction efficiency and reliability. The first light-emitting device 451 may further include a wire 451W connecting a substrate to a light-emitting device electrode (not shown) exposed at an upper portion thereof.

Although in the light-emitting units 200, 300, and 400 of the second to fourth embodiments with reference to FIGS. 26 to 28, a shape, arrangement, and type of the light-emitting devices are limitedly described, but are not limited thereto, and the shape and arrangement structure of the light-emitting devices may be variously changed.

Figure 29:
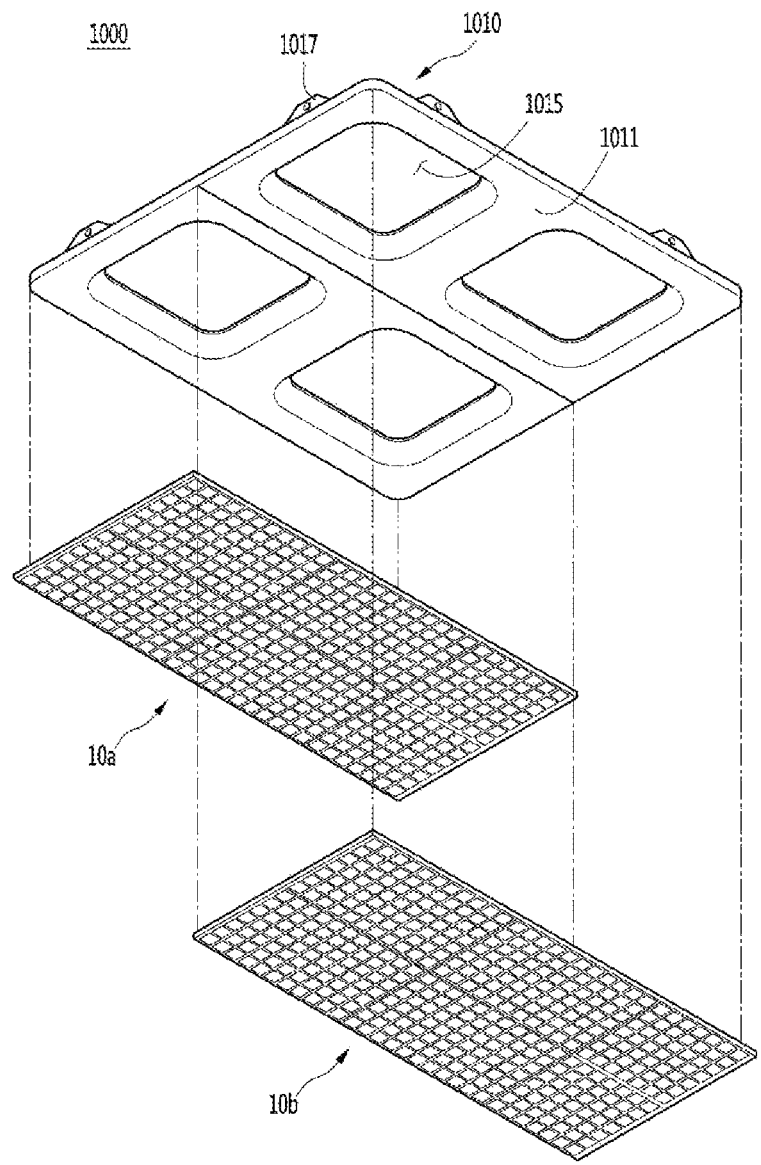
FIG. 29 is a perspective view illustrating a light-emitting cabinet of an embodiment.
Figure 30:
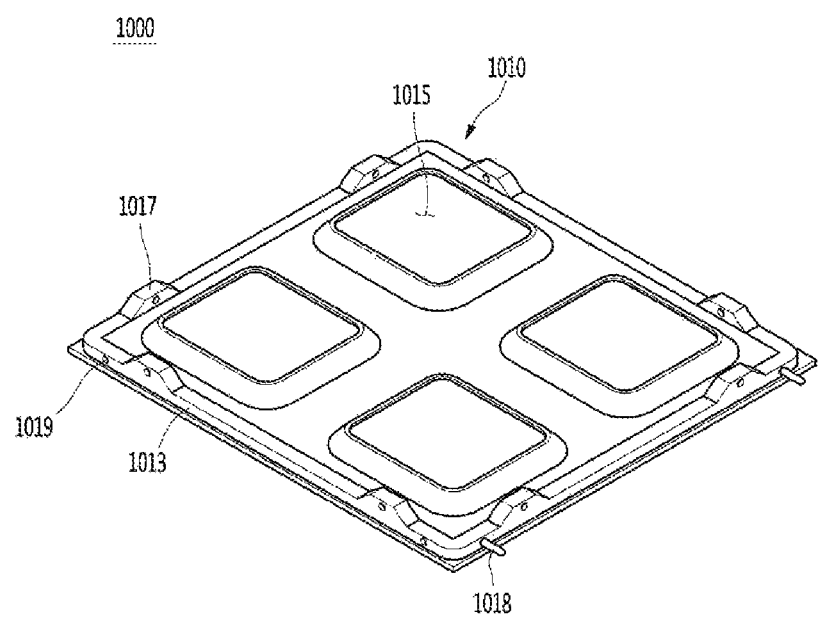
FIG. 30 is a perspective view illustrating a lower portion of the light-emitting cabinet of an embodiment.
Figure 31:
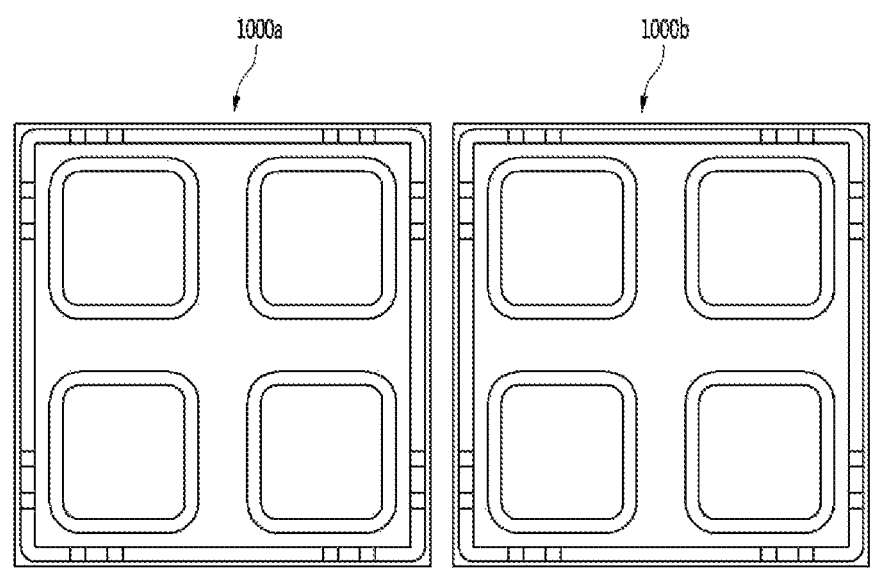
FIG. 31 is a plan view illustrating lower portions of first and second light-emitting cabinets of an embodiment.
Figure 32:
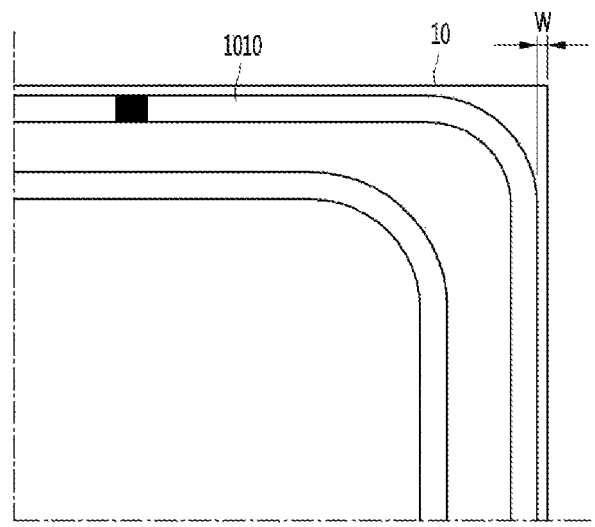
FIG. 32 is a view illustrating a lower portion of a corner of the light-emitting cabinet of an embodiment.
Figure 33:
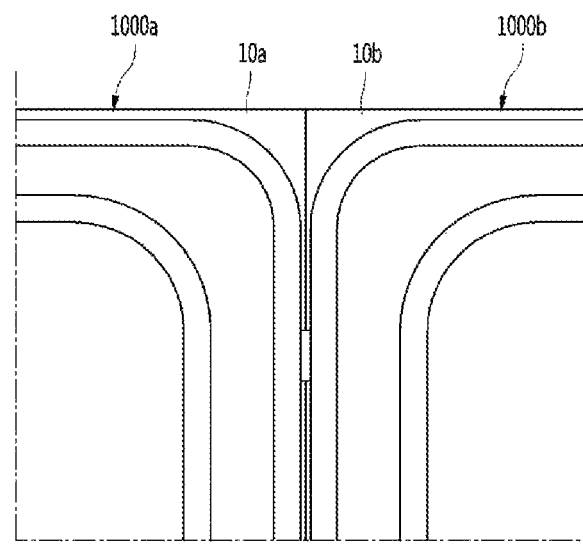
FIG. 33 is a view illustrating a state in which the first and second light-emitting cabinets of an embodiment are combined.
Figure 34:
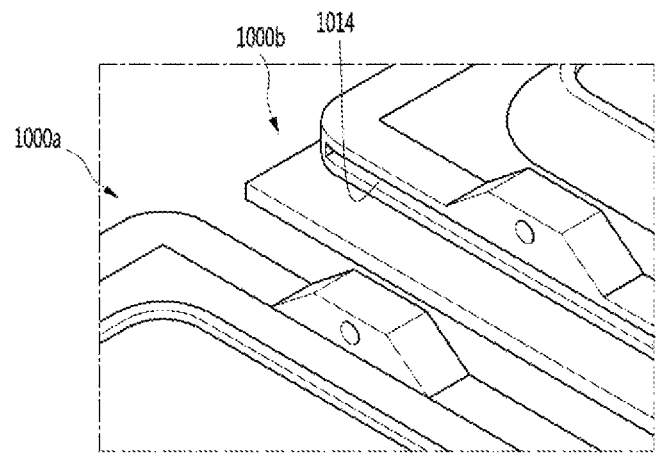
FIG. 34 is a perspective view illustrating a fastening structure of the first and second light-emitting cabinets of an embodiment.

FIG. 29 is a perspective view illustrating a light-emitting cabinet of an embodiment, FIG. 30 is a perspective view illustrating a lower portion of the light-emitting cabinet of an embodiment, FIG. 31 is a plan view illustrating lower portions of first and second light-emitting cabinets of an embodiment, FIG. 32 is a diagram illustrating a lower portion of a corner of the light-emitting cabinet of an embodiment, FIG. 33 is a view illustrating a state in which the first and second light-emitting cabinets of an embodiment are combined, and FIG. 34 is a perspective view illustrating a fastening structure of the first and second light-emitting cabinets in an embodiment.

As shown in FIGS. 29 and 30, a light-emitting cabinet 1000 of the embodiment may include a plurality of light-emitting modules 10a and 10b. A structure including two first and second light-emitting modules 10a and 10b is described in the embodiment, but is not limited thereto. The light-emitting cabinet 1000 may be a display device of a minimum unit.

The light-emitting cabinet 1000 may include first and second light-emitting modules 10a and 10b and a support frame 1010 for supporting lower surfaces of the first and second light-emitting modules 10a and 10b. Here, upper surfaces of the first and second light-emitting modules 10a and 10b may be a display region in which a light-emitting unit is disposed, and the lower surfaces thereof may be a non-display region in which a driving circuit is mounted.

Each of the first and second light-emitting modules 10a and 10b may employ technical features of the light-emitting module of FIGS. 1 to 28.

The support frame 1010 may support the first and second light-emitting modules 10a and 10b and may include a function of heat dissipation. The support frame 1010 may include a plurality of openings 1015. The opening 1015 may reduce a weight of the support frame 1010, and not only prevent the first and second light-emitting modules 10a and 10b from being in contact with a driving circuit exposed to a lower surface, but also improve heat dissipation efficiency.

The support frame 1010 may include one surface 1011 of a flat structure, and the one surface 1011 may be in direct contact with the lower surfaces of the first and second light-emitting modules 10a and 10b.

The support frame 1010 may include four outer side surfaces 1013 and a plurality of protrusions 1018 and a plurality of accommodating grooves 1019 may be disposed on the four outer side surfaces 1013. For example, the support frame 1010 has the plurality of protrusions 1018 disposed on first outer side surfaces symmetrical to each other, and the plurality of accommodating grooves 1019 may be disposed on second outer side surfaces orthogonal to the first outer side surfaces and are symmetrical to each other. The plurality of protrusions 1018 and accommodating grooves 1019 may have a function for primarily fixing adjacent support frames.

The support frame 1010 may include a plurality of fastening parts 1017 protruding along an edge.

For example, referring to FIGS. 30 and 31, when first and second light-emitting cabinets 1000a and 1000b are connected to each other, the plurality of protrusions 1018 of the support frame 1010 of the first light-emitting cabinet 1000*a* may be inserted into the plurality of accommodating grooves 1019 of the support frame 1010 of the second light-emitting cabinet 1000*b*. A depth of the accommodating groove 1019 and a protruding length of the protrusion 1018 may be changed such that side portions of the first and second light-emitting modules 10*a* and 10*b* may be in contact with each other without warpage. Here, the side portions of the first and second light-emitting modules 10*a* and 10*b* in contact with each other may be substrates included in the first and second light-emitting modules 10*a* and 10*b*, respectively.

It will be described in more detail with reference to FIGS. 30 to 33.

Referring to FIGS. 30 to 33, side portions of the four edges of the light-emitting module 10 may protrude outward beyond side portions of the four edges of the support frame 1010. A distance W between one side portion of the light-emitting module 10 and the corresponding side portion of the support frame 1010 may be 0.5 to 2.0 mm. Side portions of the light-emitting module 10 protruding outward beyond side portions of the support frame 1010 may be in direct contact with side surfaces of the first and second light-emitting modules 10*a* and 10*b* when the first and second light-emitting cabinets 1000*a* and 1000*b* adjacent to each other are connected. The first and second light-emitting cabinets 1000*a* and 1000*b* adjacent to each other may be disposed such that the protrusion 1018 and the accommodating groove 1019 face each other along an outer side surface thereof. A length of the protrusion 1018 and a depth of the accommodating groove 1019 may be changed such that side portions of the first and second light-emitting modules 10*a* and 10*b* adjacent to each other may be in contact with each other without warpage. For example, when the distance W is 0.5 mm, the length of the protrusion 1018 may be 1.0 mm larger than the depth of the accommodating groove 1019. Referring to FIG. 33, the protrusion 1018 may be exposed by 1.0 mm. The length of the protrusion 1018 and the depth of the accommodating groove 1019 of the embodiment may be changed depending on the distance W so that the side portions of the first and second light-emitting modules 10*a* and 10*b* adjacent to each other may be in contact with each other without warpage.

That is, the light-emitting module 10 protruding outward beyond the support frame 1010 may seamlessly implement the adjacent first and second light-emitting modules 10*a* and 10*b* by a side surface contact of the adjacent first and second light-emitting modules 10*a* and 10*b*.

Referring to FIGS. 33 and 34, the embodiment may include first and second fastening parts 1017*a* and 1017*b* connecting the first and second light-emitting cabinets 1000*a* and 1000*b*, which are adjacent to each other. The first and second fastening parts 1017*a* and 1017*b* may adopt technical features of the fastening part 1017 in FIG. 30.

The first and second fastening parts 1017*a* and 1017*b* may face each other.

The first and second light-emitting cabinets 1000*a* and 1000*b* may be secondarily fixed by inserting a fastening member 1100 passing through a fastening hole of the first and second fastening parts 1017*a* and 1017*b*.

Figure 35:
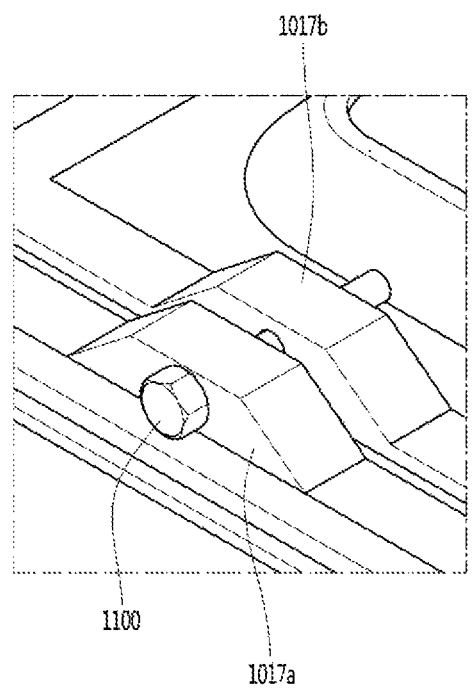
FIG. 35 is a perspective view illustrating a coupling portion of first and second light-emitting cabinets of another embodiment.

FIG. 35 is a perspective view illustrating a coupling portion of first and second light-emitting cabinets of another embodiment.

Referring to FIG. 35, first and second light-emitting cabinets 1000*a* and 1000*b* of another example may include a slit groove 1014 and a protrusion (not shown) along an outer side surface thereof. The slit groove 1014 and a protrusion (not shown) may implement stable fixing of the adjacent first and second light-emitting cabinets 1000*a* and 1000*b* by widening a contact area as compared with the plurality of accommodating grooves 1019 and the plurality of protrusions 1018 provided in the light-emitting cabinet 1000 of the embodiment of FIG. 30.

The light-emitting cabinet 1000 shown in FIGS. 29 to 35 supports the plurality of light-emitting modules 10*a* and 10*b*, and a coupling structure for stable fixing between the adjacent first and second light-emitting cabinets 1000*a* and 1000*b* is limitedly described, but is not limited thereto, and the coupling structure may be variously changed.

The light-emitting cabinet 1000 of the embodiment may implement uniform color and uniform brightness by including the light-emitting module 10 capable of providing full color.

The light-emitting cabinet 1000 of the embodiment may simplify a configuration and implement slimness and high brightness by including the light-emitting module 10 of a COB type, and power consumption may be reduced by simplifying an electrical connection structure.

The light-emitting cabinet 1000 of the embodiment may improve productivity and yield by including the light-emitting module 10 of a COB type.

The light-emitting cabinet 1000 of the embodiment may include the light-emitting module 10 capable of providing full color, so that a display device having excellent linearity of images and videos may be provided.

The light-emitting cabinet 1000 of the embodiment may include the light-emitting module 10 capable of providing full color, so that videos or images with excellent color purity and color reproduction may be provided.

Figure 36:
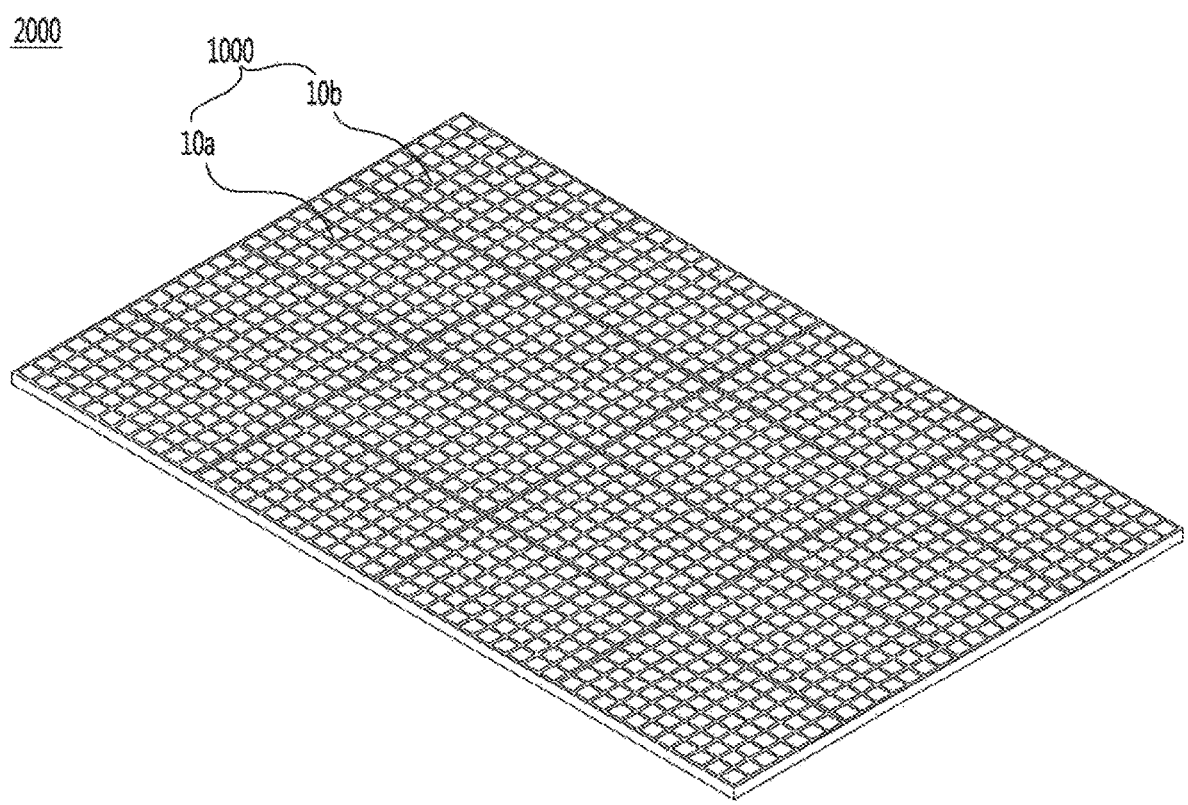
FIG. 36 is a perspective view illustrating a display device of an embodiment.

FIG. 36 is a perspective view illustrating a display device of an embodiment.

As shown in FIGS. 29 to 36, a display device 2000 of the embodiment may include a plurality of light-emitting cabinets 1000. The display device 2000 of the embodiment will be described as an example of a large display device of over 100 inches such as an electronic display board.

The plurality of light-emitting cabinets 1000 may include light-emitting modules 10*a* and 10*b* in which a full color light-emitting unit, in which a plurality of light-emitting devices are directly mounted on a driving substrate in a COB type, is disposed in an accommodating part of a black matrix. The light-emitting modules 10*a* and 10*b* may employ technical features of FIGS. 1 to 28.

The display device 2000 of the embodiment may not only simplify a configuration of the display device but also simultaneously implement slimness by including the light-emitting module including the light-emitting unit, which may provide full color.

The display device 2000 of the embodiment implements videos and images by including the light-emitting device providing full color, and thus has an advantage of excellent color purity and color reproduction.

The display device 2000 of the embodiment may simplify a configuration and implement slimness and high brightness by including the light-emitting module of a COB type, and may reduce power consumption by simplifying a configuration of electrical connection.

The display device 2000 of the embodiment may improve productivity and yield by including the light-emitting module of a COB type.

The display device 2000 of the embodiment may provide a display device, which has excellent linearity of images and videos by including the light-emitting modules 10a and 10b capable of providing full color.

The display device 2000 of the embodiment may provide images and videos, which are excellent in color purity and color reproduction by including the light-emitting modules 10a and 10b capable of providing full color.

The display device 2000 of the embodiment implements videos and images by the light-emitting device having excellent linearity, and thus a clear large display device over 100 inches may be implemented.

The embodiment may implement a large display device over 100 inches with high resolution at low cost.

The light-emitting device package may display images and videos, but is not limited thereto, and may be applied to lighting units, back light units, indicating devices, lamps, street lamps, vehicle lighting devices, vehicle display devices, smart watches, and etc., but are not limited thereto.

When used as a back light unit of an image display device, the light-emitting device package may be used as an edge type back light unit or a direct type back light unit, when used as a light source of a lighting device, may be used as a light apparatus or bulb type, and may be used as a light source of a mobile device.

Semiconductor devices have a laser diode in addition to the above-described light-emitting diode.

The laser diode, like the semiconductor devices, may include a first conductive type semiconductor layer, an active layer, and a second conductive type semiconductor layer of the above-described structure. In addition, the laser diode uses an electro-luminescence phenomenon that light is emitted when a current is flowing after bonding of a p-type first conductive type semiconductor and an n-type second conductive type semiconductor, but it has differences in direction and phase of emitted light. That is, the laser diode may emit light having one specific wavelength (monochromatic beam) in the same phase and same direction by using a stimulated emission phenomenon and a reinforcing interference phenomenon, and thus may be used for optical communication or medical equipment and semiconductor process equipment due to such characteristics.

Examples of a light receiving device may include a photodetector, a kind of transducer, which converts an intensity of detected light to an electrical signal. Such a photodetector may include a photocell (silicon, selenium), a photoconductive device (cadmium sulfide, cadmium selenide), a photodiode (PD) (for example, PD which has a peak wavelength in visible blind spectral region or true blind spectral region), a phototransistor, a photomultiplier, a phototube (vacuum, gas sealed), an infra-red (IR) detector, etc., but embodiments are not limited thereto.

In addition, a semiconductor device like a photodetector may be fabricated by using a direct band gap semiconductor, which has excellent light conversion efficiency. Alternatively, there are various structures of photodetectors, and the most general structures of photodetectors include a pin type photodetector using p-n junction, a Schottky type photodetector using Schottky junction, and a metal semiconductor metal (MSM) type photodetector.

The photo diode, like the semiconductor devices, may include a first conductive type semiconductor layer, an active layer, and a second conductive type semiconductor layer of the above-described structure, and configured with p-n junction or pin structure. The photodiode is operated by applying a reverse bias or zero bias, and when light is incident on the photodiode, electrons and holes are generated and a current flows. In this case, the size of a current is almost proportional to the intensity of light incident on the photodiode.

A photocell or solar cell is a kind of photodiodes, and may convert light to a current. The solar cell, like the semiconductor devices, may include a first conductive type semiconductor layer, an active layer, and a second conductive type semiconductor layer of the above-described structure.

In addition, it may be used as a rectifier of an electronic circuit through rectifying characteristics of a general diode by using p-n junction, and may be applied to an oscillation circuit or the like by applying to a very high frequency circuit.

In addition, the above-described semiconductor devices are not only implemented by semiconductor, and may further include a metal material in some cases. For example, the semiconductor device like a light receiving device may be implemented with at least one of Ag, Al, Au, In, Ga, N, Zn, Se, P, and As, and may be implemented with a semiconductor material doped with a p-type or n-type dopant, or an intrinsic semiconductor material.

Embodiments are mostly described above. However, they are only examples and do not limit the present invention. A person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. A display device comprising:
   a support frame; and
   a plurality of light-emitting cabinets including a plurality of light-emitting modules disposed on the support frame,
   wherein each of the plurality of light-emitting modules includes a substrate, a light-emitting unit on the substrate, and a black matrix disposed on the substrate to surround the light-emitting unit, and the light-emitting unit has a width of less than 500 μm,
   wherein the light-emitting unit includes:
      a first light-emitting device mounted directly on the substrate and configured to emit a red wavelength;
      a second light-emitting device mounted directly on the substrate and configured to emit a green wavelength;
      a third light-emitting device mounted directly on the substrate and configured to emit a blue wavelength; and
      a molding part covering the first to third light-emitting devices,
      wherein each of the first to third light-emitting devices has a width of 200 μm or less,
      the light-emitting unit and the black matrix are a chip on board (COB) type, and
      wherein a height between an upper surface of the molding part and upper surfaces of the first to third light-emitting devices is less than 50% of a height of a sapphire substrate of each of the first to third light-emitting devices.

2. The display device of claim 1, wherein
   the support frame includes one flat surface in direct contact with the plurality of light-emitting modules, a plurality of openings passing through the other surface from the one surface, and outer side surfaces, wherein the outer side surfaces include a plurality of protrusions and a plurality of grooves thereon.

3. The display device of claim 1, wherein four edges of the substrate protrudes outward beyond four edges of the support frame, and a distance between an end portion of edges of the plurality of light-emitting modules and an end portion of an edge of the support frame is 0.5 to 2.0 mm.

4. The display device of claim 2, further comprising a driving circuit disposed on a lower surface of the plurality of light-emitting modules,
wherein the plurality of openings are disposed at each of the plurality of light-emitting cabinets, and the plurality of openings face the driving circuit.

5. The display device of claim 1, wherein the plurality of light-emitting cabinets include first and second light-emitting cabinets adjacent to each other,
wherein the first light-emitting cabinet includes a first fastening part disposed on the other surface of the support frame and a protrusion disposed along an outer side surface thereof, and the second light-emitting cabinet includes a second fastening part disposed on the other surface of the support frame and a slit groove disposed along an outer side surface thereof, wherein the first and second fastening parts have holes facing each other, and include a fastening member passing through the hole, and
the protrusion is in contact with the slit groove.

6. The display device of claim 2, wherein the first to third light-emitting devices are disposed at a distance of 50 μm or more.

7. The display device of claim 2, wherein a distance between the first to third light-emitting devices and a side surface of the molding part closest to the first to third light-emitting devices is 25 μm or more.

8. The display device of claim 1, wherein a cross-sectional thickness of the black matrix corresponds to a cross-sectional thickness of the light-emitting unit.

9. The display device of claim 2, wherein the molding part includes a black filler.

10. A method of manufacturing a light-emitting module, comprising:
aligning a plurality of first to third light-emitting devices on a first carrier film;
forming a molding layer on the first carrier film and the plurality of first to third light-emitting devices;
forming a plurality of light-emitting units by cutting the molding layer; and
mounting the plurality of light-emitting units on a substrate,
wherein a black matrix is disposed between the plurality of light-emitting units,
wherein the light-emitting unit includes:
a first light-emitting device mounted directly on the substrate and configured to emit a red wavelength;
a second light-emitting device mounted directly on the substrate and configured to emit a green wavelength;
a third light-emitting device mounted directly on the substrate and configured to emit a blue wavelength; and
a molding part covering the first to third light-emitting devices,
wherein each of the first to third light-emitting devices has a width of 200 μm or less,
the light-emitting unit and the black matrix are a chip on board (COB) type, and
wherein a height between an upper surface of the molding part and upper surfaces of the first to third light-emitting devices is less than 50% of a height of a sapphire substrate of each of the first to third light-emitting devices.

11. The method of manufacturing the light-emitting module of claim 10, further comprising:
aligning the plurality of light-emitting units to a second carrier film between the forming of the plurality of light-emitting units and the mounting of the plurality of light-emitting units; and
forming a light-emitting device block by forming the black matrix between the plurality of light-emitting units on the second carrier film;
wherein the plurality of light-emitting units correspond to the light-emitting device block.

12. The method of manufacturing the light-emitting module of claim 10, wherein forming the black matrix on the substrate and the plurality of light-emitting units occurs after the mounting of the plurality of light-emitting units.

13. The method of manufacturing the light-emitting module of claim 10, wherein the first to third light-emitting devices are disposed to be spaced apart from each other at a distance of 50 μm or more in the aligning of the plurality of first to third light-emitting devices on the first carrier film.

* * * * *